United States Patent

Basker et al.

(10) Patent No.: US 8,303,791 B2
(45) Date of Patent: Nov. 6, 2012

(54) APPARATUS AND METHOD FOR ELECTROCHEMICAL PROCESSING OF THIN FILMS ON RESISTIVE SUBSTRATES

(75) Inventors: Veeraraghavan S. Basker, Yorktown Heights, NY (US); John M. Cotte, New Fairfield, CT (US); Hariklia Deligianni, Tenafly, NJ (US); Matteo Flotta, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 1062 days.

(21) Appl. No.: 12/198,274

(22) Filed: Aug. 26, 2008

(65) Prior Publication Data

US 2009/0057154 A1 Mar. 5, 2009

Related U.S. Application Data

(63) Continuation of application No. 11/417,146, filed on May 4, 2006, now abandoned.

(51) Int. Cl.
C25D 7/12 (2006.01)
C25D 5/00 (2006.01)

(52) U.S. Cl. .......................................... 205/91; 205/157
(58) Field of Classification Search .............. 205/91, 205/157
See application file for complete search history.

(56) References Cited

U.S. PATENT DOCUMENTS

| | | | | |
|---|---|---|---|---|
| 3,890,176 A * | 6/1975 | Bolon | ............................. | 438/708 |
| 4,247,373 A * | 1/1981 | Shimano et al. | .............. | 438/384 |
| 4,473,795 A * | 9/1984 | Wood | ............................. | 324/501 |
| 4,507,181 A * | 3/1985 | Nath et al. | ........................ | 205/91 |
| 5,086,328 A * | 2/1992 | Kasai et al. | .................... | 257/441 |
| 6,010,774 A | 1/2000 | Kadokura et al. | | |
| 6,042,712 A * | 3/2000 | Mathieu | ......................... | 205/209 |
| 6,340,544 B1 | 1/2002 | Akutsu et al. | | |
| 6,478,935 B1 * | 11/2002 | Ueno | ............................. | 204/237 |
| 6,797,769 B2 | 9/2004 | Akutsu et al. | | |
| 6,974,531 B2 | 12/2005 | Andricacos et al. | | |
| 6,979,544 B2 * | 12/2005 | Keen | ............................. | 435/6.11 |
| 7,332,062 B1 * | 2/2008 | Reder et al. | ................. | 204/230.6 |
| 7,449,098 B1 * | 11/2008 | Mayer et al. | ................... | 205/118 |
| 2002/0036146 A1 * | 3/2002 | Akutsu et al. | .................. | 205/316 |
| 2003/0060092 A1 * | 3/2003 | Johnson et al. | ............... | 439/894 |
| 2004/0005723 A1 * | 1/2004 | Empedocles et al. | ............. | 438/1 |
| 2005/0077183 A1 * | 4/2005 | Yagi et al. | ........................ | 205/91 |
| 2005/0224359 A1 * | 10/2005 | Su et al. | ......................... | 205/157 |
| 2005/0280105 A1 * | 12/2005 | Andreoni et al. | .............. | 257/410 |
| 2006/0166474 A1 * | 7/2006 | Vereecken et al. | ............. | 438/584 |
| 2006/0292851 A1 * | 12/2006 | Lin et al. | ........................ | 438/618 |

FOREIGN PATENT DOCUMENTS

EP  1132500 A2  9/2001

(Continued)

*Primary Examiner* — Harry D Wilkins, III
*Assistant Examiner* — Bryan D. Ripa
(74) *Attorney, Agent, or Firm* — Connolly Bove Lodge & Hutz LLP; Daniel P. Morris, Esq.

(57) ABSTRACT

An electrochemical process comprising: providing a 125 mm or larger semiconductor wafer in electrical contact with a conducting surface, wherein at least a portion of the semiconductor wafer is in contact with an electrolytic solution, said semiconductor wafer functioning as a first electrode; providing a second electrode in the electrolytic solution, the first and second electrode connected to opposite ends of an electric power source; and irradiating a surface of the semiconductor wafer with a light source as an electric current is applied across the first and the second electrodes. The invention is also directed to an apparatus including a light source and electrochemical components to conduct the electrochemical process.

13 Claims, 13 Drawing Sheets

FOREIGN PATENT DOCUMENTS

| | | |
|---|---|---|
| JP | 57141919 A | 9/1982 |
| JP | 2005015871 A | 1/2005 |
| KR | 20010089210 A | 9/2001 |
| KR | 20020073643 A | 9/2002 |
| WO | WO-03010364 A2 | 2/2003 |

* cited by examiner

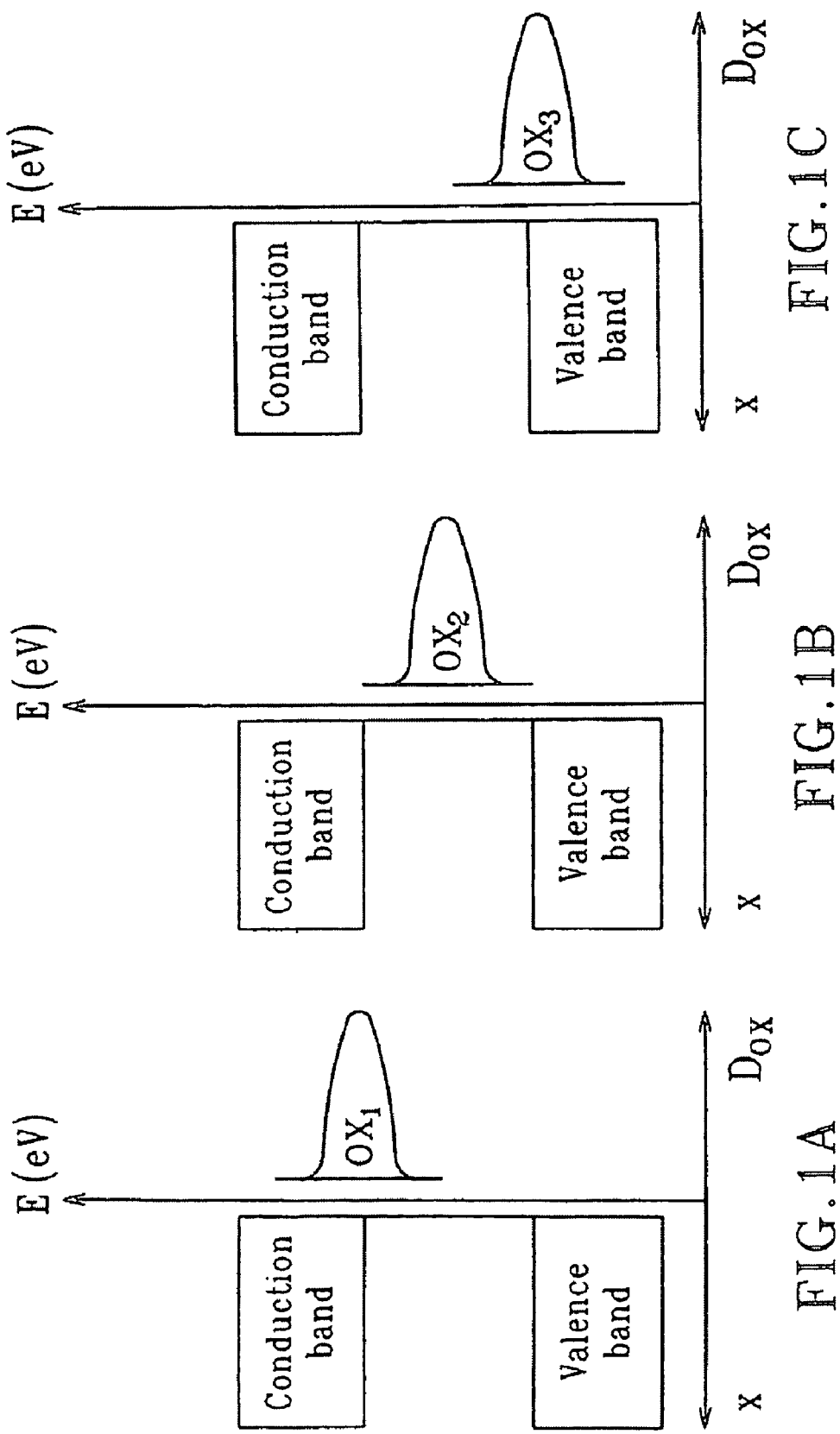

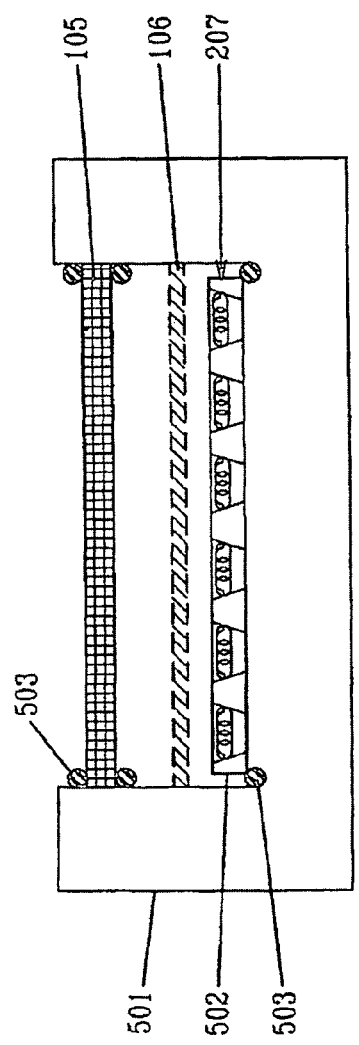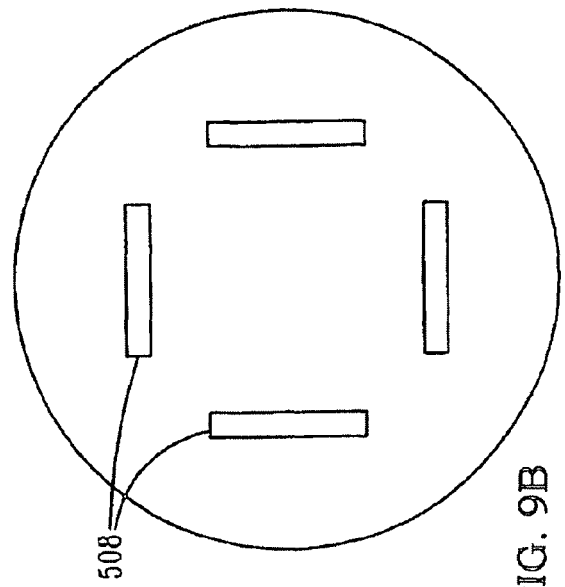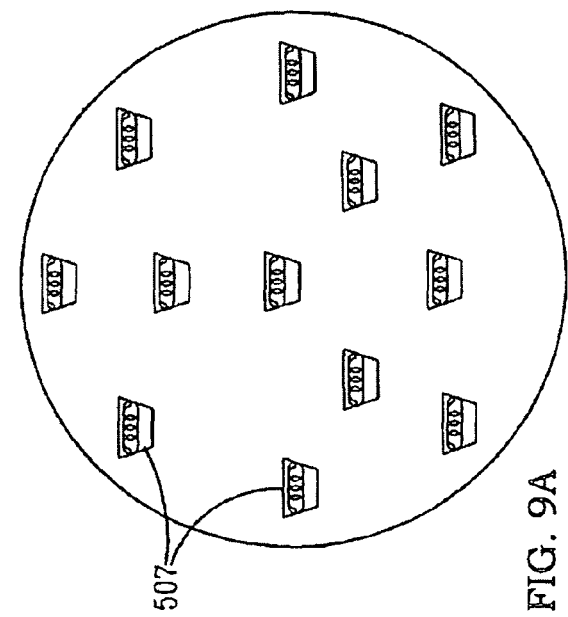

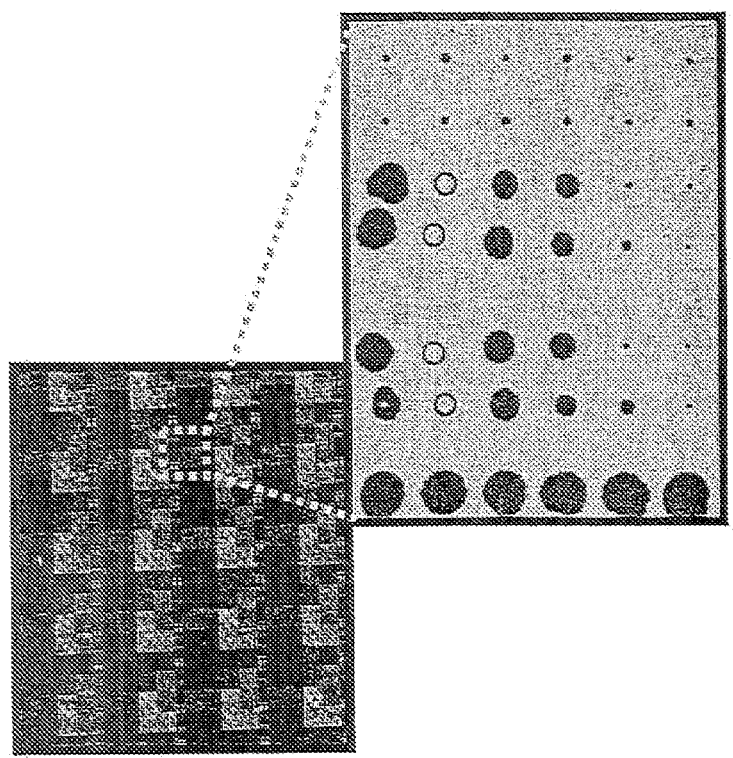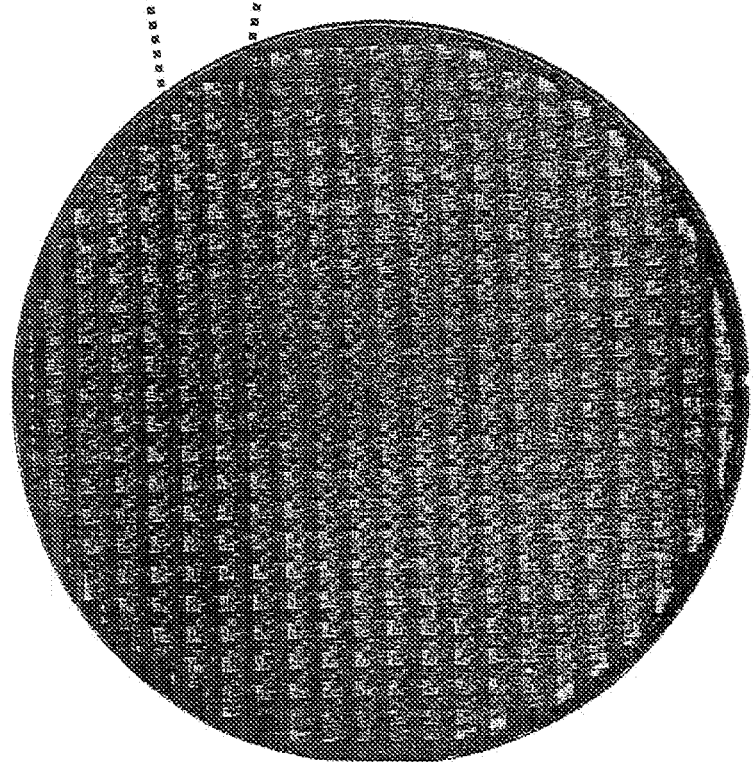
FIG. 10

APPARATUS AND METHOD FOR ELECTROCHEMICAL PROCESSING OF THIN FILMS ON RESISTIVE SUBSTRATES

This application is a Continuation of co-pending application Ser. No. 11/417,146, filed on May 4, 2006, and for which priority is claimed under 35 U.S.C. §120, the entire contents of which are hereby incorporated by reference.

FIELD OF THE INVENTION

This invention relates to the electrochemical processing of thin films directly on semiconducting or insulating layers and an apparatus for implementing such processes.

BACKGROUND OF THE INVENTION

In semiconductor manufacturing and, in particular, for forming metal layers or interconnects, the metal is typically electrodeposited on a metallic seed or plating base layer. The seed layer is typically formed on a semiconductor wafer by physical vapor deposition (PVD) or chemical vapor deposition (CVD). The current flow driving the electrodeposition is passed laterally through the seed layer from the electrical contact established at the seed layer edges. Current through the semiconductor wafer itself and any dielectric layers contained within the semiconductor wafer is essentially negligible.

Electrochemical processing of semiconducting/insulating materials can occur where the semiconductor wafer, typically a thin oxide coating or semiconductor, can conduct small amounts of an electric current. Conductance can be provided by transport of charges directly through the valence or conduction band of a semiconducting/insulating semiconductor wafer. The latter case becomes important when working with semiconducting oxides such as $TiO_2$, $ZnO$ and $Ta_2O_5$, as well as any n-type wide band-gap semiconductor. For thin oxide/insulating layers, electron tunneling or current leakage can also be a mechanism for conductivity. Defects can also provide many electron states in the band gap of an insulator and for a high density of gap states these defects can provide a pathway for the electric current.

This principle is illustrated schematically in FIG. 1. When empty oxidant states in solution overlap with the electron states of a conduction band of a semiconductor (FIG. 1A), electroreduction of oxidants will be possible at an n-doped semiconductor wafer (conduction band electrons available) but not at a p-doped semiconductor wafer (no conduction band electrons available in the dark). If the Gaussian distribution of oxidant states corresponds with energies in the band gap of a semiconductor, no charge transport will be possible and the oxidant can be expected to be inactive at this particular semiconductor wafer (FIG. 1B). However, if oxidant states in solution overlap with the valence band of a semiconductor, charge transfer is possible both for n-doped as well as p-doped semiconductor wafers (FIG. 1C). In sum, the electronic structure of the insulator and semiconductor semiconductor wafer in combination with the electronic structure of the redox electrolyte in solution allows for only certain charge transfer combinations.

SUMMARY OF THE INVENTION

An electrochemical method comprising: providing a 125 mm or larger semiconductor wafer in electrical contact with a conducting surface, wherein at least a portion of the semiconductor wafer is in contact with an electrolytic solution, and the semiconductor wafer functions as a first electrode; providing a second electrode in the electrolytic solution, wherein the first and second electrodes are connected to opposite ends of an electric power source; and irradiating a surface of the semiconductor wafer with a light source as an electric current is applied across the first and the second electrodes.

In one embodiment, the electrochemical method is a cathodic electrodeposition process of a 125 mm or larger, p-type semiconductor wafer with an optional insulating layer. The process comprises: positioning the p-type semiconductor wafer in an electrolytic solution; positioning a counter electrode in the electrolytic solution; illuminating a front side of the p-type semiconductor wafer or the insulating layer, if present, or illuminating a back side of the semiconductor wafer, with a light source; and applying an electric current to the semiconductor wafer and to the counter electrode.

In another embodiment, the electrochemical method is as an anodic electrochemical process of a 125 mm or larger, n-type semiconductor wafer with a metal layer. The anodic process comprises: positioning the p-type semiconductor wafer in an electrolytic solution; positioning a counter electrode in the electrolytic solution; illuminating a front side or the back side of the n-type semiconductor wafer with a light source; and applying an electric current to the semiconductor wafer and to the counter electrode. Typically, the anodic electrochemical process is an electroetching process of the metal layer or an anodization process of the metal layer.

The invention is also directed to an apparatus including a light source and electrochemical components to conduct the electrochemical methods of the invention.

BRIEF DESCRIPTION OF THE DRAWINGS

These and other features of the present invention will become apparent upon consideration of the following detailed description of the invention when read in conjunction with the drawings, in which:

FIGS. 1A to 1C show schematic illustrations of electronic configurations for conduction and valence bands in a semiconductor wafer and an oxidant containing solution, with a Gaussian distribution of density of electron states;

FIG. 9 is a schematic representation of another apparatus of the invention;

FIG. 10 shows a 200 mm silicon wafer electroplated selectively with copper;

DETAILED DESCRIPTION OF THE INVENTION

The generation of an electrochemical current at the substrate/electrolyte interface in an electrochemical reaction depends on several factors. In the case of a metal semiconductor wafer, such studies are focused on the electrolyte interaction since the electrons required for the reaction are available in abundance at all possible energy levels. However, in the case of a semiconducting or insulating semiconductor wafers, attention should be directed to semiconductor wafer/electrolyte interactions. These factors include: the energetic position and density of electron states of the electrolyte with respect to the valence band edge as well as the conduction band edge of the oxide and underlying semiconductor wafer. Conductance is dependent on whether charge transfer at an interface occurs between filled and empty electron states.

The present invention describes an electrochemical process for obtaining thin films directly on a 125 mm or larger semiconductor wafer with or without an insulating layer, and an apparatus to conduct the process. The electrochemical process comprises a backside contact scheme for electrical connection to a semiconductor wafer with or without an insulating layer, wherein the top surface of the semiconductor wafer/layer acts as an electrode, e.g., a working electrode, in the electrochemical process. The desired electrochemical reaction can occur on the surface of the semiconductor wafer. Alternatively, the desired electrochemical reaction can occur on a thin metallic/semiconductor/insulating layer disposed on top of the semiconductor wafer. The process does not require an underlying seed layer to carry the current.

Figure 2A:
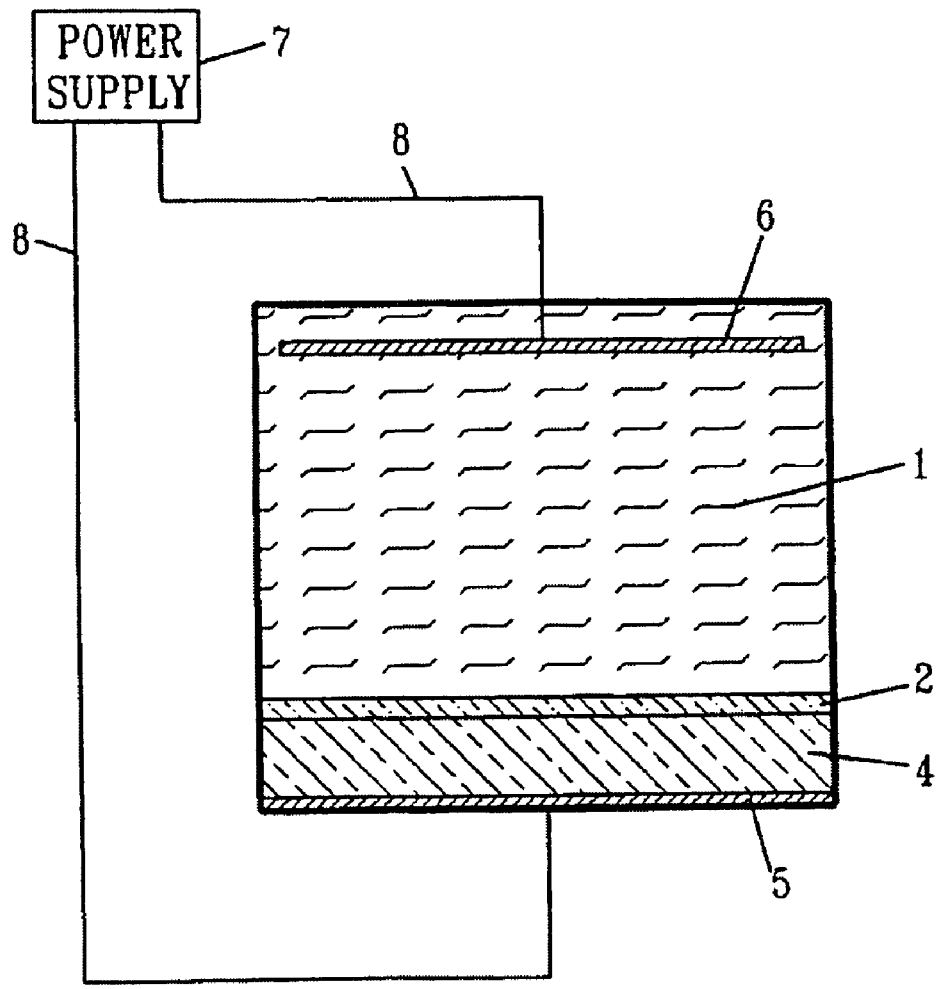
FIGS. 2A and 2B show, in cross sectional view, a schematic illustration of blanket electrodeposition using through-gate dielectric current flow.
Figure 2B:
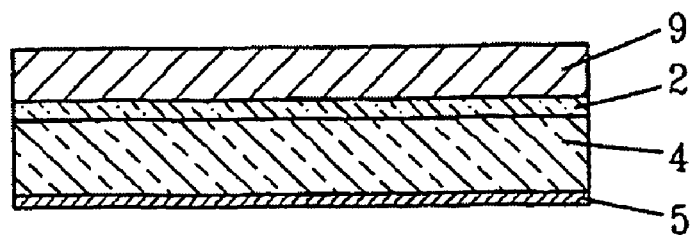

FIGS. 2A and 2B illustrate a contact scheme of one embodiment of the invention. A dielectric layer 2 (also referred to as an insulating layer or insulator) such as a thin gate oxide is placed atop a 125 mm or larger semiconductor wafer 4 such as silicon. Electrical contact 5 is made to the semiconductor wafer 4 as a backside contact. Alternatively, if the insulating layer 2 is a semiconductor (such as a wide band-gap semiconductor, for example, n-ZnO, n-TiO$_2$ or n-Ta$_2$O$_5$) for which an ohmic contact scheme is known, an electrical contact can be made directly to the insulating layer. An electrolyte solution 1 is placed in contact with dielectric layer with the semiconductor wafer front side fully submerged, or optionally, with the semiconductor wafer partially submerged in areas where processing is desired. The semiconductor wafer acts as one electrode and a counter electrode 6 is positioned in the electrolyte solution. While semiconductor wafer 4 and insulating layer 2 of FIG. 2 are shown as planar, it is understood that semiconductor wafer 4 can also have some topography and insulating layer 2 can be a conformal layer.

For electrochemical processing an electrical current is applied to the semiconductor wafer (electrode) 4 and the counter electrode 6 via a power supply 7 and electrical leads 8. If desired, the electrochemical potential of the structure/electrolyte can be controlled more accurately by the introduction of a third electrode, that is, a reference electrode (not shown), which has constant electrochemical potential. Examples of reference electrodes include a saturated calomel electrode (SCE) and silver-silver chloride (Ag/AgCl) reference electrodes or other metal reference electrodes such as Cu or Pt. FIG. 2B shows the formation of a plated metal film 9 at the structure/electrolyte on the dielectric or insulating layer 2. Although the scheme of FIG. 2 depicts the plating of a metal film 9, one of ordinary skill in the art would recognize that variations of the scheme of FIG. 2 would include other electrochemical processes such as etching or anodization of metals to selectively generate thin layers of interest.

Due to the strongly resistive nature of the electron transfer process across a 125 mm or larger semiconductor wafer with or without an insulating layer, electrochemical processing can be expected to occur preferentially on regions that are the most conductive since the current will follow the path of least resistance. In this regard, electrochemical processing by current transport across such semiconductor wafers can be an extremely selective process. Several factors or parameters may determine the selectivity and include: underlying semiconductor wafer, insulator thickness, type of insulator, electrolyte solution, physical blockage, light, and other external means.

Current-voltage characteristics, and thus electrode kinetics, are also determined by the makeup of the underlying semiconductor wafer. These characteristics may vary dramatically, for example, according to the type of semiconductor wafer materials used and the type of doping used. Thus, they can be expected to be different for metals, n-type semiconductors, p-type semiconductors and combinations thereof. For example, electrochemical reduction of metal ions from solution for metal electrodeposition on the semiconductor wafer can be achieved either via the conduction band (electron capture process) or the valence band (hole injection process) for n-type semiconductor wafers, whereas electroreduction is only possible via a hole-injection process at p-type semiconductor wafers (in the dark), or when driven into inversion. In addition, the semiconductor material (including its band-gap and energy of band edges) and the dopant concentration (including its flat band potential and depletion layer thickness) can determine the electrochemical characteristics of the semiconductor/insulator/electrolyte (SIE) contact.

In order to allow cathodic conduction band processes at 125 mm or larger, p-type semiconductor wafers and anodic valence-band processes at 125 mm or larger, n-type semiconductor wafers, photon excitation of valence-band electrons over the band gap is necessary. This can be achieved by illumination of the semiconductor wafer, for example, via illumination through the electrolyte solution or from the back-side of the semiconductor wafer. Selectivity can be obtained in several ways. For example, careful selection of the light wavelength will activate electrochemical processes only at those semiconductor wafers or oxides where either the complete band gap can be crossed or gap states can be activated to mediate the electrode reaction. Alternatively, a narrow laser beam can be used to directly write an etched or deposited pattern, or a mask can be used to illuminate only certain regions of the semiconductor wafer surface.

In one embodiment, the electrochemical process involves the electrodeposition of a metal layer on a 125 mm or larger semiconductor wafer. In such a process, the semiconductor wafer acts as the negative electrode (cathode) and provides the electrons required for the electrodeposition of the metal. The electrodeposition process also includes providing a light source in order to facilitate the electrodeposition of the metal layer on semiconductor wafers with low or no electrons such as p-type silicon.

In another embodiment, the electrochemical process involves the electroetching and/or anodization of a metal layer from a 125 mm or larger semiconductor wafer. In this case, the electrochemical process requires positive charges and the semiconductor wafer acts as the positive electrode (anode). Hence, in the case of n-type silicon, the electrochemical process also includes providing a light source in order to facilitate the electroetching and/or anodization of a metal layer from the semiconductor wafer. The electroetch or anodizing process will include a metal layer comprising one or more metals selected from Al, Ti, Zr, Nb, Hf, Ta, W, Mo and Cd. The semiconductor wafer can comprise Si, Ge, In, Ga, Sb, P and any combination thereof.

Figure 3:
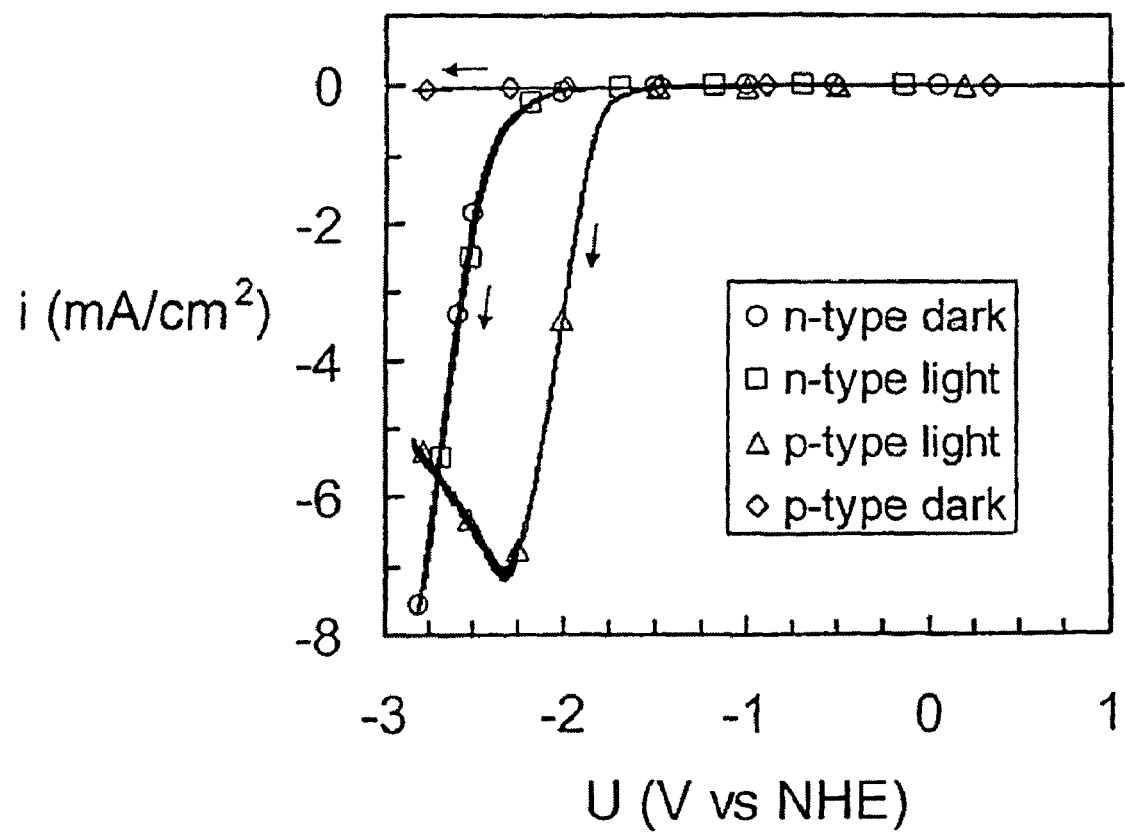
FIG. 3 shows current-voltage curves for n-type and p-type $Si/SiO_2$(1 nm)/$HfO_2$(3 nm) in a nickel sulfate solution in the dark and under white-light illumination.

In this regard, FIG. 3 depicts the current-voltage characteristics (scanning towards negative voltage) for n-type and p-type $Si/SiO_2/HfO_2$ semiconductor wafers in a nickel sulfate bath (0.1M $NiSO_4$+0.1M $H_3BO_3$) in the dark and under white-light illumination (21V, 150 W halogen lamp) during a potentiodynamic scan towards negative potentials (forward scan). In FIG. 3, the current density i is given in milliamps per square centimeter ($mA/cm^2$) and the electrode potential U is given in Volts versus the Normal Hydrogen Electrode (NHE). The scan rate was 50 millivolts per second and the electrode rotation rate was 250 rpm.

As shown in FIG. 3, an n-type semiconductor wafer shows an exponential increase of the current at negative voltages past −2V in the dark and under illumination. The p-type semiconductor wafer does not show any current flow in the dark, and shows a cathodic current for $Ni^{2+}$ reduction below −1.5V only if the sample is illuminated with light. This phenomenon allows for the selective plating of n-type and p-type regions simultaneously exposed through mask openings. For example, n-type regions can be selectively metallized by electrodeposition in the dark and the p-type regions can be metallized with another metal of choice by photo-electrodeposition. In the latter case, both the n- and p-type areas are plated (i.e. the metal already deposited on the n-type areas gets another metal coating on top), or by the correct choice of deposition potential, the p-type regions are metallized selectively (no additional plating in n-type regions).

For p-type semiconductor wafers, the current becomes limited by the light intensity at sufficiently negative applied potentials. The incident photon flux and thus the measured photo-current are lowered if light is absorbed by the solution and by the deposited metal. The current density for plating at p-type semiconductor wafers can be controlled by the light-intensity. For example, pulse plating can be done at constant potential by strobing or chopping the light beam. The current-voltage characteristics show the selectivity of metal deposition on n-type and p-type semiconductor wafers. According to the above given example, Ni could be deposited selectively in the dark on n-type regions at potentials more negative than −2V (by applying constant voltage or constant current). After the metal has been deposited in the n-type regions, Ni could be deposited selectively at the p-type regions under illumination at potentials between −0.9V and −1.8V.

On the other hand, if the current-voltage characteristics are obtained in the positive potential ranges, n-Si would require light for obtaining electrochemical currents and p-type would not need light for the electrochemical reactions. Hence, for electroetching/anodization reactions, light would be required for n-type semiconductor wafers.

The electrodeposition of select metals on resistive substrates according to the invention and the processing conditions used are discussed in U.S. patent application Ser. No. 11/050,790 filed Jan. 27, 2005 and assigned to International Business Machines, the entire disclosure of which is incorporated herein by reference.

Figure 4A:
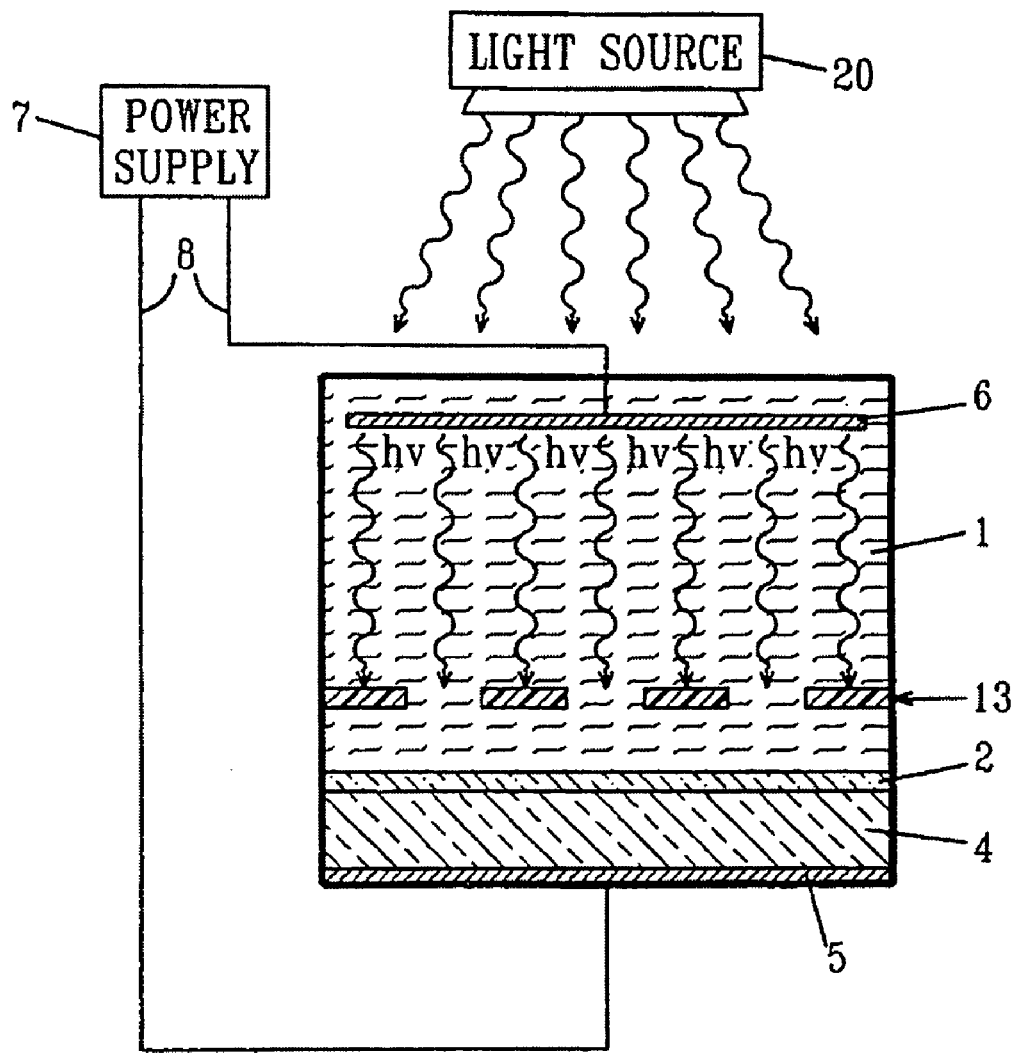
FIGS. 4A and 4B show, in cross sectional view, a schematic illustration of the selective photo-electrodeposition of a metal pattern on a blanket gate dielectric by illumination of the semiconductor wafer through a mask while applying a potential or current.
Figure 4B:
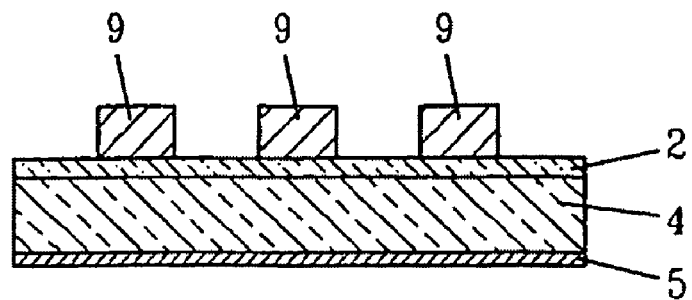

FIG. 4 depicts an arrangement as described for FIG. 2A, but where selective photo-electrodeposition of a metal pattern 9 on a blanket gate dielectric 2 is achieved by illumination of the semiconductor wafer with a light source 20 through several openings in a mask 13 while applying a current to the semiconductor wafer 4 with an electrical contact 5 and the counter electrode 6. FIG. 4A depicts an arrangement for photo-electrodeposition and FIG. 4B shows the patterned metal obtained in the illuminated regions which where not blocked by the mask. In addition, any method of patterning that provides open areas can be used in order to obtain the desired reaction in the open regions. For example, the patterning can be obtained with the help of a photoresist on the wafer.

The electrochemical process can be used in conjunction with both metallic and doped or undoped semiconductor wafers of 125 mm or larger. Exemplary doped or undoped semiconductor wafers can be selected from a Si semiconductor wafer, a Ge semiconductor wafer or a (Si—Ge) semiconductor wafer, or a doped or undoped binary, tertiary and quaternary semiconductor wafer comprising Ga, As, P, Sb, In, Se and Al. Other exemplary semiconductor wafers include a doped or undoped II-VI semiconductor wafer comprising Cd, Zn, Te, Se, S and combination of each thereof, and a doped or undoped oxide semiconductor wafer comprising Ti or Zr oxides, a Cu or Sr based semiconductor wafer or a semiconductor-on-insulator semiconductor wafer selected from silicon-on-insulator or silicon germanium-on-insulator combinations. Still other exemplary semiconductor wafers can comprise electroluminescent polymer selected from polyacetylene, poly(dialkoxy p-phenylene-vinylene, poly(dialkylfluorene) and the derivatives of each thereof.

As stated, the electrochemical process of the invention includes electrodeposition processes in which one or more metals selected from the group consisting of Ru, Re, Ni, Pd, Co, Pt, Rh, Cr and Mn and any combination of each metal thereof is deposited on the semiconductor wafer. Other select metals and non-metals selected from the group consisting of Os, Ir, Sb, Bi, Sn, In, Ga, Ge, As, Fe, Zn, Cd, Se, Te, Cu, Ag, Au, W, Hg, Tl, Po, Pb, Mo, V, B, C, P, S and any combination of each metal thereof can also be deposited on the semiconductor wafer.

Figure 5:
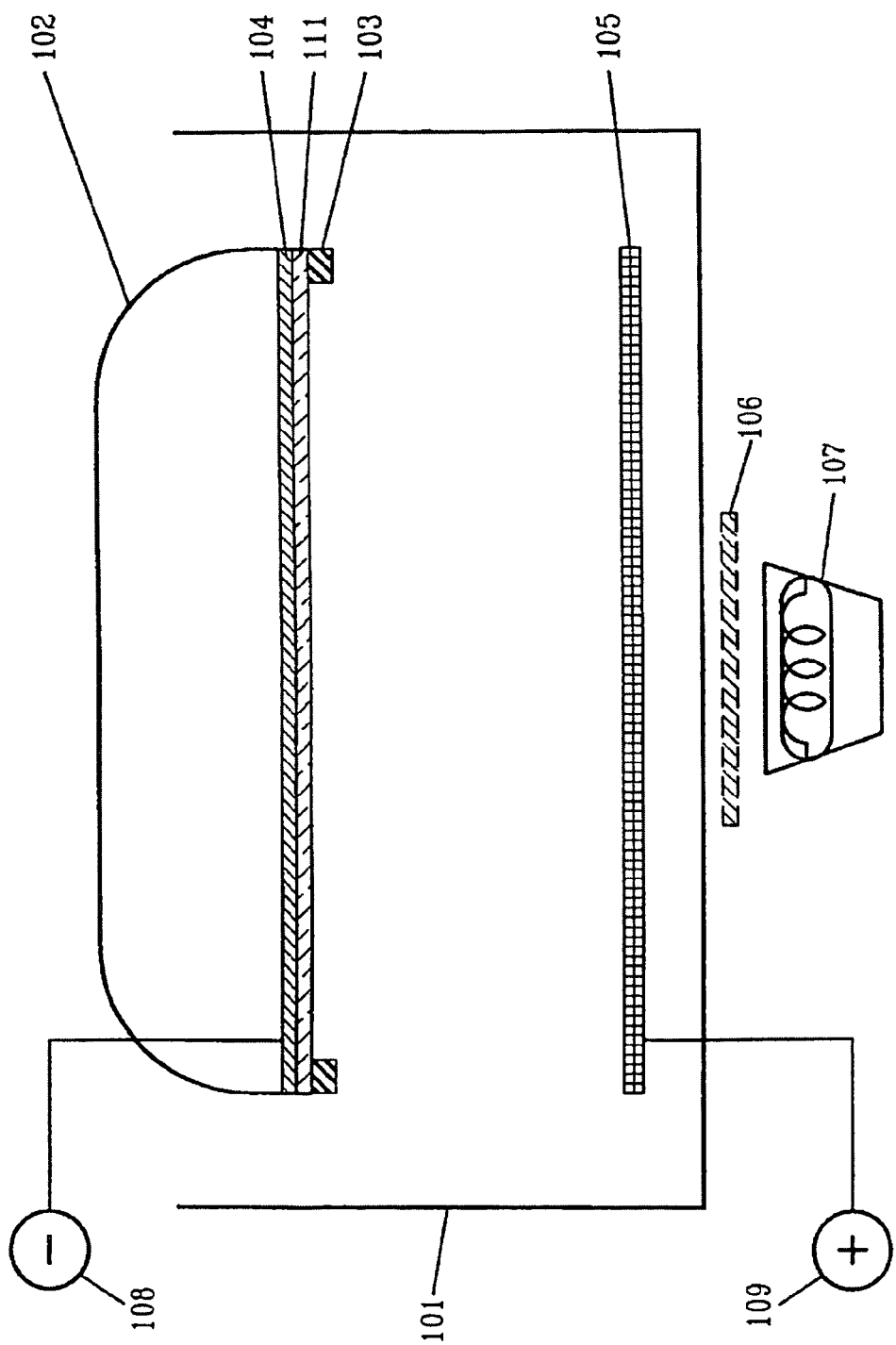
FIG. 5 is a schematic representation of an apparatus of the invention.

FIG. 5 depicts an electrochemical apparatus that can be used in the described electrochemical processes of the invention. The design of the apparatus is aimed towards processing 125 mm or larger, particularly 200 mm or 300 mm semiconductor wafers. However, the apparatus can be modified to handle wafers of any shape or size. The apparatus primarily consists of an electrolyte container tank 101. The silicon semiconductor wafer 111 is held by a tool head 102 equipped with pneumatic sealing and a ring seal 103. The ring seal 103 pushes the semiconductor wafer, against the metal plate 104, thereby preventing the liquid from reaching the back side of the semiconductor wafer. The metal plate 104 provides electrical contact to the semiconductor wafer. Electrical contact to a semiconductor wafer such as Si can be made by a backside contact arrangement. In addition, electrical contact to the semiconductor wafer can be made through an opening in an oxide layer. A conductive or electric pathway from the point of contact to the dielectric on the semiconductor wafer can pass one or more interfaces and provides the electrical current path for the electrochemical process.

Alternatively, the electrical contact can also include a dry solid-state contact. A dry solid-state contact to a semiconductor wafer can include an ohmic contact, which is typically created by providing a highly doped surface (about $10^{19}$ $cm^{-3}$) through implantation of dopant elements or creation of surface defects. Further, certain metals can also be applied to the surface of the semiconductor wafer in order to facilitate electrical connectivity. For example, metals with low work functions such as indium can provide an ohmic contact for n-type semiconductor wafers. Metals with high work functions can provide an ohmic contact to p-type semiconductor wafers. The apparatus further consists of a counter electrode 105. The counter electrode in this configuration is a mesh-type electrode so that the semiconductor wafer can be illuminated through the solution. The illumination is provided by a light source 107, whose wavelength can be chosen depending on the required energy levels for the desired electrodeposition. The light source can be monochromatic such as a laser or a composite light source such as a halogen lamp. Further, the light source can include an arrangement to vary the light intensity in order to control the reaction rates.

The electrochemical apparatus of FIG. 5 is particularly useful if the plating solution is transparent or semi-transparent to the light source so that sufficient amounts of light can penetrate to the semiconductor wafer to facilitate the electrochemical reaction. The apparatus can also include a shutter 106 disposed between the semiconductor wafer and the light source. The apparatus can be used for pulse and pulse-reversal modes of electrochemical processing of the semiconductor wafers. The metal contact 104 for the semiconductor wafer 111 is connected to one end of a power source 108 so that the semiconductor wafer can act as the cathode or the anode depending on the nature of the electrochemical process being performed. For example, in the case of electrodeposition, the semiconductor wafer, e.g., p-type silicon, is the negative electrode (cathode). Alternatively, in the case of etching or anodizing, the semiconductor wafer, e.g. n-type silicon, is the positive electrode (anode). The counter electrode is then connected to the opposite end of the power source 109 to complete the electrical circuitry for each electrochemical process.

Figure 6:
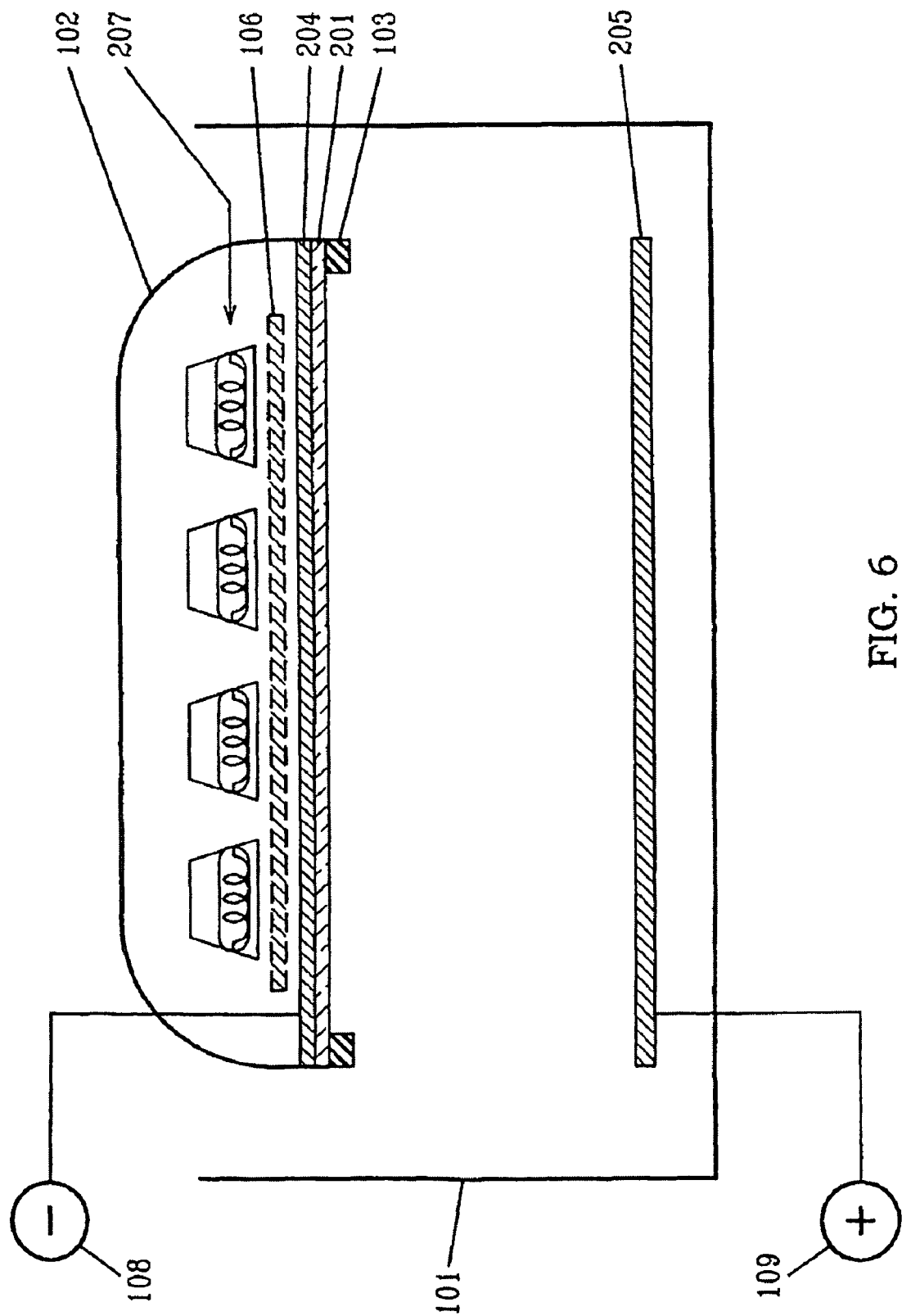
FIG. 6 is a schematic representation of another apparatus of the invention.

FIG. 6 depicts a modification of the tool head of FIG. 5. In this arrangement, metal contact 204 is a mesh-type metal contact for providing electrical contact to semiconductor wafer 201, and the lamp assembly 207 is placed within the tool head 102. Such design is advantageous with electrochemical processing conditions in which the electrolyte is near-opaque or opaque to light. In this case, the light source helps in generating the current carriers (electrons or holes) directly from the back of the semiconductor wafer without being absorbed by the electroplating solution. The counter electrode 205 can be a metal sheet or a mesh-type electrode. The apparatus can also include a shutter 106 disposed between the semiconductor wafer and the light source 207.

Figure 7:
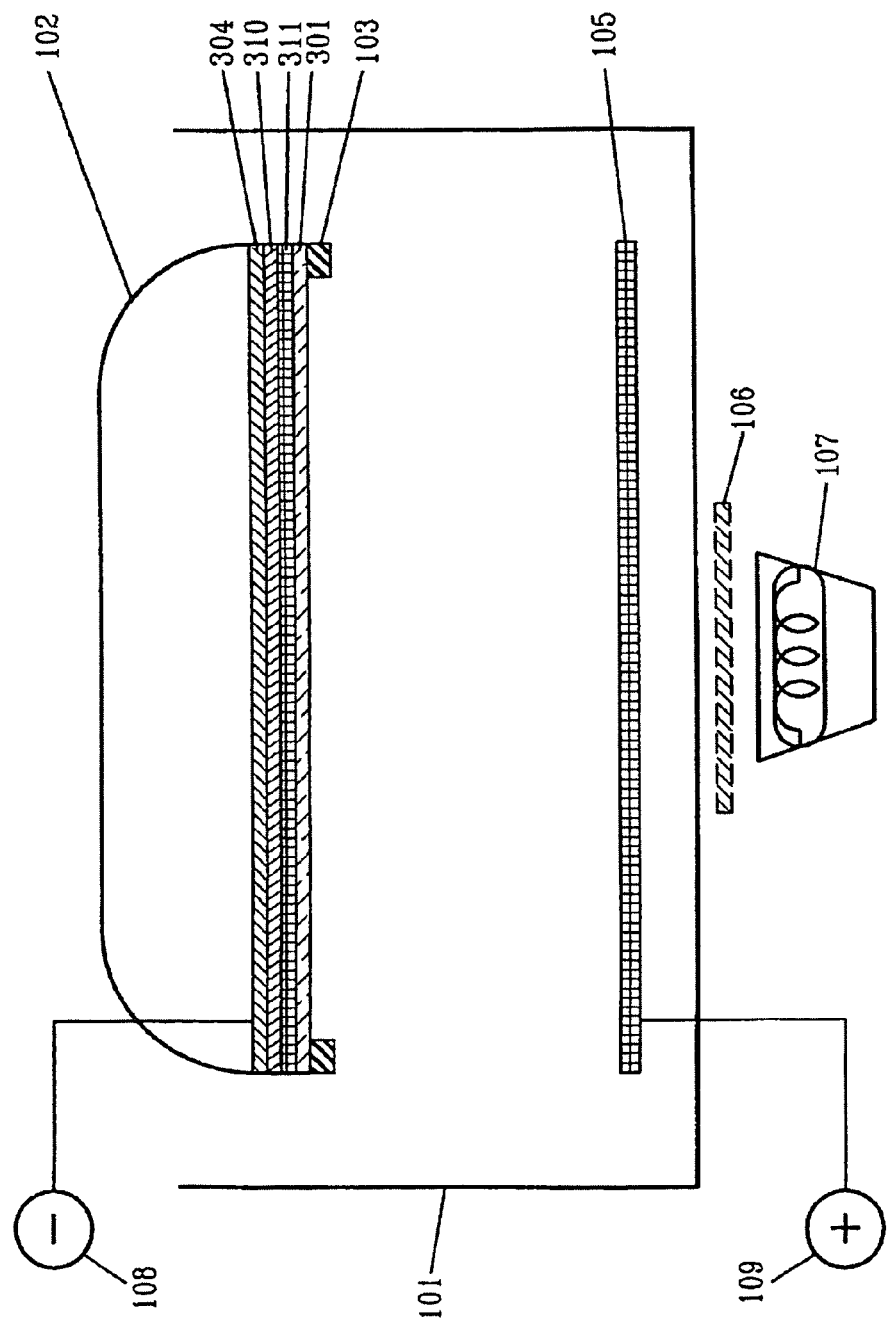
FIG. 7 is a schematic representation of another apparatus of the invention.

FIG. 7 depicts a tool modification in which uniform electrical contact is provided to the semiconductor wafer with a spring-loaded metal plate 310. Such an arrangement can minimize a non-uniform contact between the semiconductor wafer and the metal plate. The spring loaded metal plate 310 is electrically connected to a back plate 304. As the semiconductor wafer 301 pushes against the ring seal 103, the springs provide uniform pressure distribution on the surface of the semiconductor wafer and provide uniform current distribution across the back of the semiconductor wafer.

Alternatively, instead of using a spring-loaded metal plate, a spongy or mesh contact 310' can be used to distribute the current uniformly across the semiconductor wafer. Further, in order to enhance the uniform current distribution, another high-conducting mesh 311 is connected to the spring-loaded plate 310.

Figure 8:
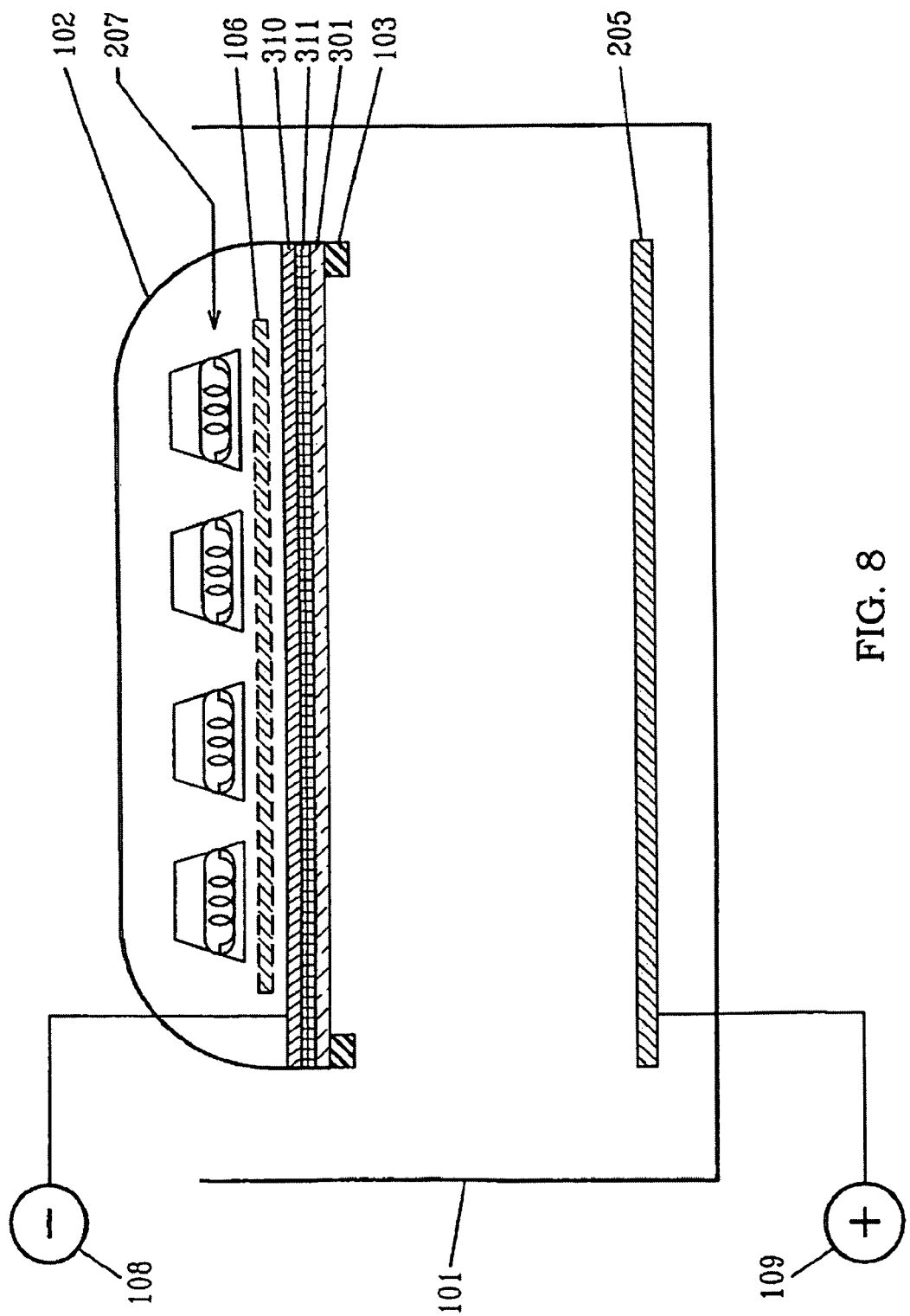
FIG. 8 is a schematic representation of another apparatus of the invention.

FIG. 8 depicts a further modification of the tool head of FIG. 7. In this case, the apparatus combines the modification of FIG. 6. The spring loaded plate 310 along with a high-conductivity mesh 311 provides uniform current distribution to the back of the semiconductor wafer 301 when it is pushed against the ring-seal 103. The lamp assembly 207 is placed inside the tool head so as to enable electrochemical processing of semiconductor wafers in which the electrolyte used is translucent or opaque to the light source.

FIG. 9 shows the apparatus modification in which the single counter electrode 105 and the light source 207 are contained within assembly 501. The assembly can be positioned in the tank and used to illuminate the semiconductor wafer. This arrangement can be used in the case of transparent or semi-transparent solutions. The glass (or other transparent material) case 502 housing the lamp assembly 207 (for e.g., LED or halogen lamp) is protected against electrolyte leaking or seeping with o-rings 503. The counter electrode 105 in the form of a mesh is held in place with the help of o-rings 503. The lamp assembly 207 can be designed for any number of lamps and orientation. Two such lamp designs are shown in FIGS. 9A and 9B, in which low-intensity lamps 507 and high-intensity lamps 508, respectively, can be arranged for illuminating the semiconductor wafer.

EXAMPLES

Copper Electrodeposition:

A plating solution comprising from 1 g/liter to 300 g/liter of $CuSO_4$, 1 ml/liter to about 250 ml/liter of $H_2SO_4$ and 1 to 10000 ppm of $Cl^-$ can be used. For example, the plating solution can comprise about 240 g/liter of $CuSO_4$ and about 100 g/liter of $H_2SO_4$, having a pH from about 1 to about 2. The source of the $Cl^-$ is sodium chloride. In addition, other inorganic constituents such as bromides, iodides, fluorides, sulfides, sulfates, boric acid, borates and metal salts & organic additives such as surfactants, brighteners, accelerators, suppressors and levelers can be added.

In electroplating processes using the above plating baths, one or more of several methods of applying a current or voltage can be used. These include, for example: application of a constant current from 1 $mA/cm^2$ to 50 $mA/cm^2$ or equivalent potentials (electrode potentials of −2V to −3V versus NHE); and pulse plating with a first current from 5 $mA/cm^2$ to 250 $mA/cm^2$ for about 20 milliseconds to about 5 seconds such as about 0.1 second, and a second current from 1.0 $\mu A/cm^2$ up to 2 $mA/cm^2$ for about 0.1 seconds to about 10 seconds, including pulse plating with potentials of −2V to 3.5V versus NHE for about 1 cycle up to about 500 cycles such as 25 cycles. The temperature during processing can, for example, range from 20° C. to 90° C.

Included in the above processing conditions are those in which there is applied a constant current of about 10 $mA/cm^2$ for about 30 minutes at room temperature with agitation at about 100 rpm.

FIG. 10 shows an example of a 200 mm semiconductor wafer electroplated selectively with copper using the above mentioned bath and operating conditions. Copper was electroplated into deep vias with aspect ratios greater than 10, i.e, vias ranging from 1 to 40 µm in height and 0.1 to 2 µm in width. The semiconductor wafer used in this example is n-Si/TaN/Ta/Cu. The TaN/Ta/Cu layers were deposited using physical vapor deposition. The layers were very thin in the order of 100-300 Å. The liner material, typically Ta/TaN, and seed, typically Cu or Ru, was removed from the top of the vias using Chemical Mechanical Planarization (CMP) method prior to plating. The CMP process leaves the liner/seed layers only in the via regions making it the preferential conductive path. This arrangement forces the current to be conducted only in the via regions and hence Cu plates selectively.

Rhenium Electrodeposition:

A plating solution comprising from 1 g/liter to 100 g/liter of $NH_4ReO_4$ and about 1 ml/liter to about 250 ml/liter of HCl (38%) can be used. For example, the plating solution can comprise about 10 g/liter of $NH_4ReO_4$ and about 10 ml/liter of HCl (38 wt. %), having a pH from about 1 to about 2. In addition to $NH_4ReO_4$, other perrhenate salts and inorganic Re salts can be used. In addition to HCl, other chloride salts can be used. In addition, other inorganic constituents (such as bromides, iodides, fluorides, sulfides, sulfates, boric acid, borates and metal salts) and organic additives (such as surfactants), can be added.

Figure 11:
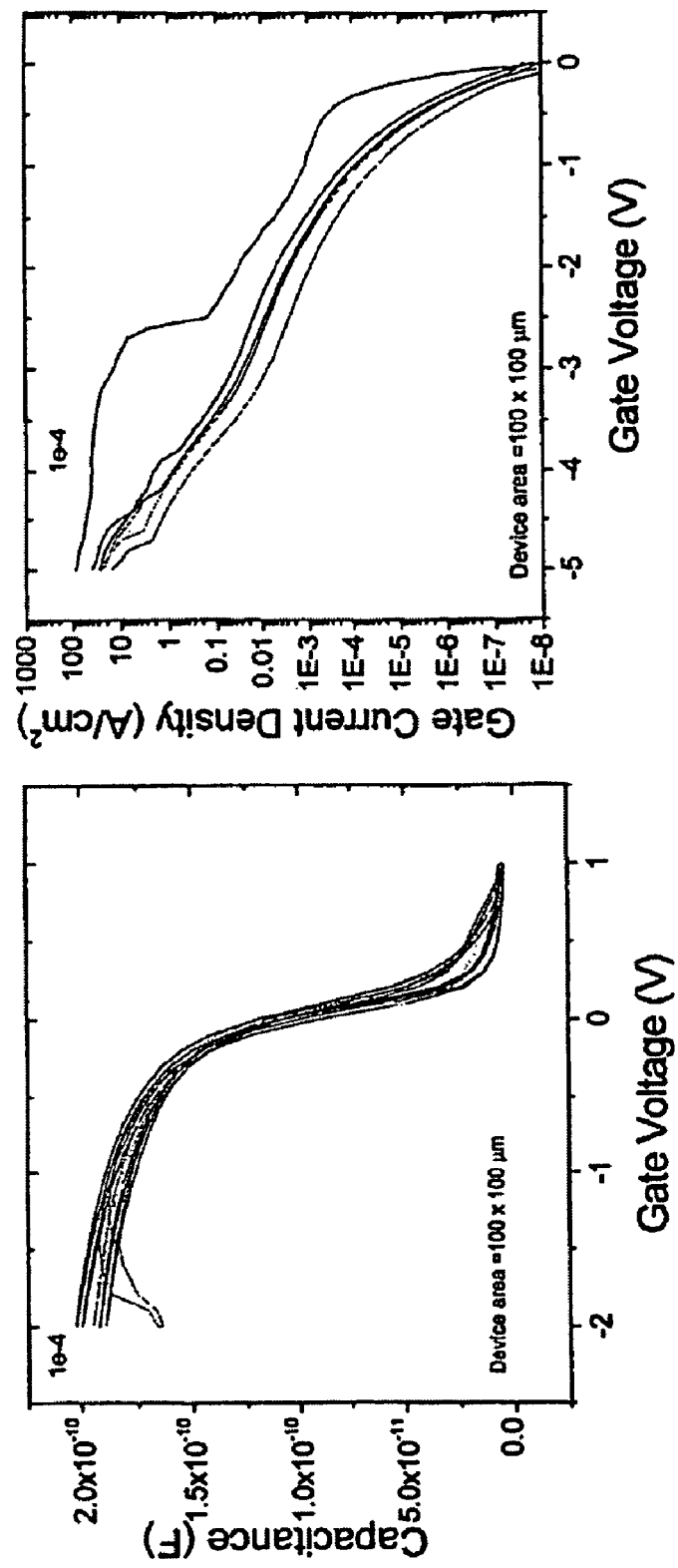
FIG. 11 is a graphical representation of capacitance-voltage characteristics for Re gates measured with a 100 μm×100 μm MOS test structure.

Patterned MOS structures were prepared by the electrodeposition of rhenium (Re) with p-type semiconductor wafers using a thick $SiO_2$ mask with openings from 1 µm×1 µm to 400 µm×400 µm. The Re was deposited selectively on top of a high-k/$SiO_2$/Si stack. The high-k material was $HfO_2$ and HfSiO, 3 nm and 4 nm, respectively, which was prepared by MOCVD. SiON (1 nm) was prepared by rapid thermal oxidation and the $SiO_2$ (1 nm) was a chemical oxide. FIG. 11 is a graphical representation of capacitance-voltage and current-voltage characteristics for Re gates measured with a 100 µm×100 µm MOS test structure. The Re gates were deposited on 200 mm, p-type Si semiconductor wafers. The figure shows the uniformity of the electrical characteristics across the wafer. The Re was deposited potentiostatically under white light illumination (−3V vs. SCE; 120V/500 W halogen lamp, 100 rpm).

In electroplating processes using the above plating baths, one or more of several methods of applying a current or voltage can be used. These include, for example: application of a constant current from 3 mA/cm² to 50 mA/cm² or equivalent potentials (electrode potentials of −2V to −3V versus NHE); and pulse plating with a first current from 5 mA/cm² to 250 mA/cm² for about 20 milliseconds to about 5 seconds such as about 0.1 second, and a second current from 1.0 µA/cm² up to 2 mA/cm² for about 0.1 seconds to about 10 seconds, including pulse plating with potentials of −2V to 3.5V versus NHE for about 1 cycle up to about 500 cycles such as 25 cycles. The temperature during processing can, for example, range from 20° C. to 90° C.

Included within the above processing conditions are those in which there is applied a constant current of about 10 mA/cm² for about 120 seconds at room temperature, with agitation at about 400 rpm.

Figure 12:
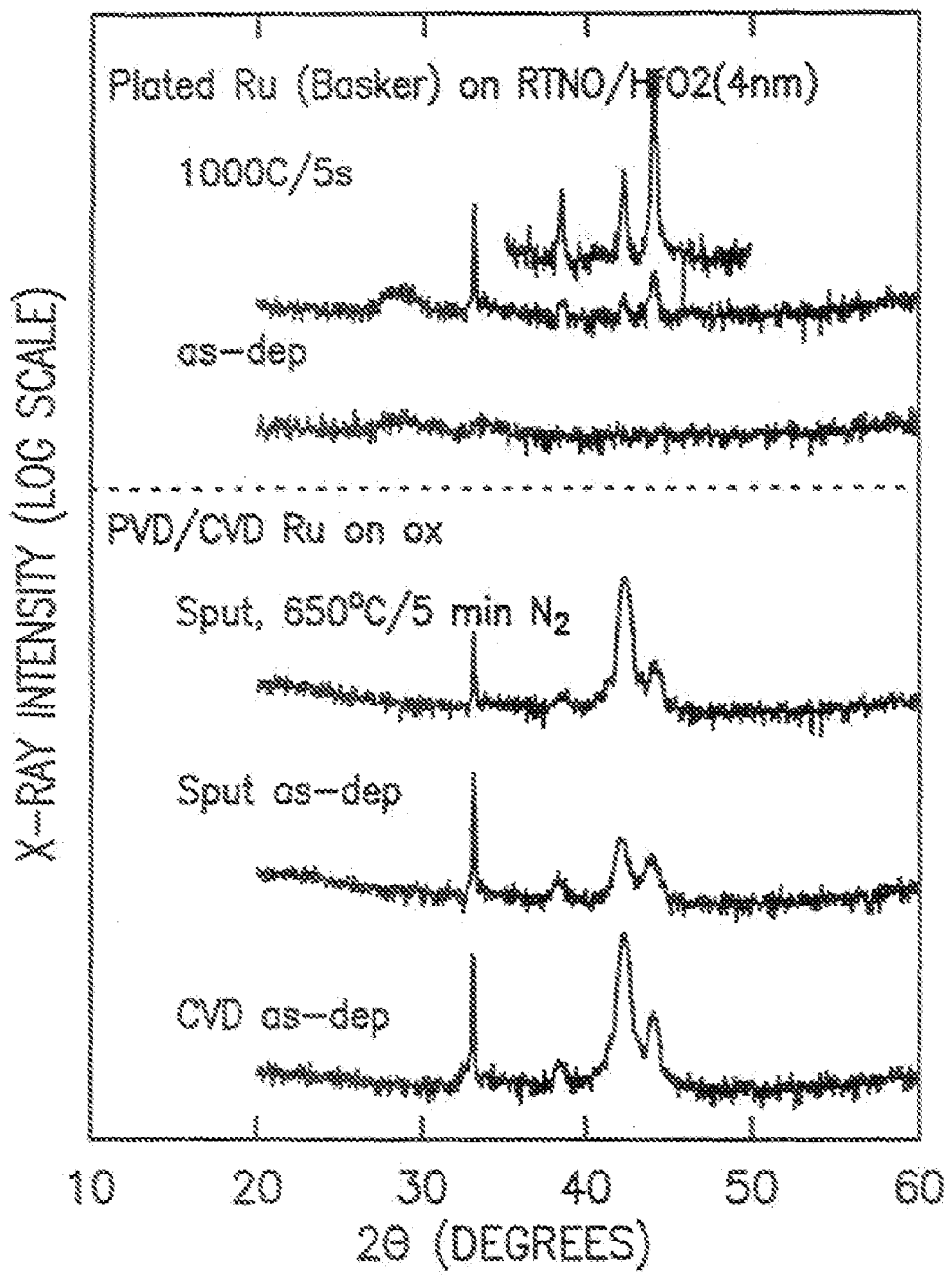
FIG. 12 exhibits the XRD diffraction patterns for deposited ruthenium using conventional methods known in the art and using the photo-electrodeposition process of the invention.
Figure 13:
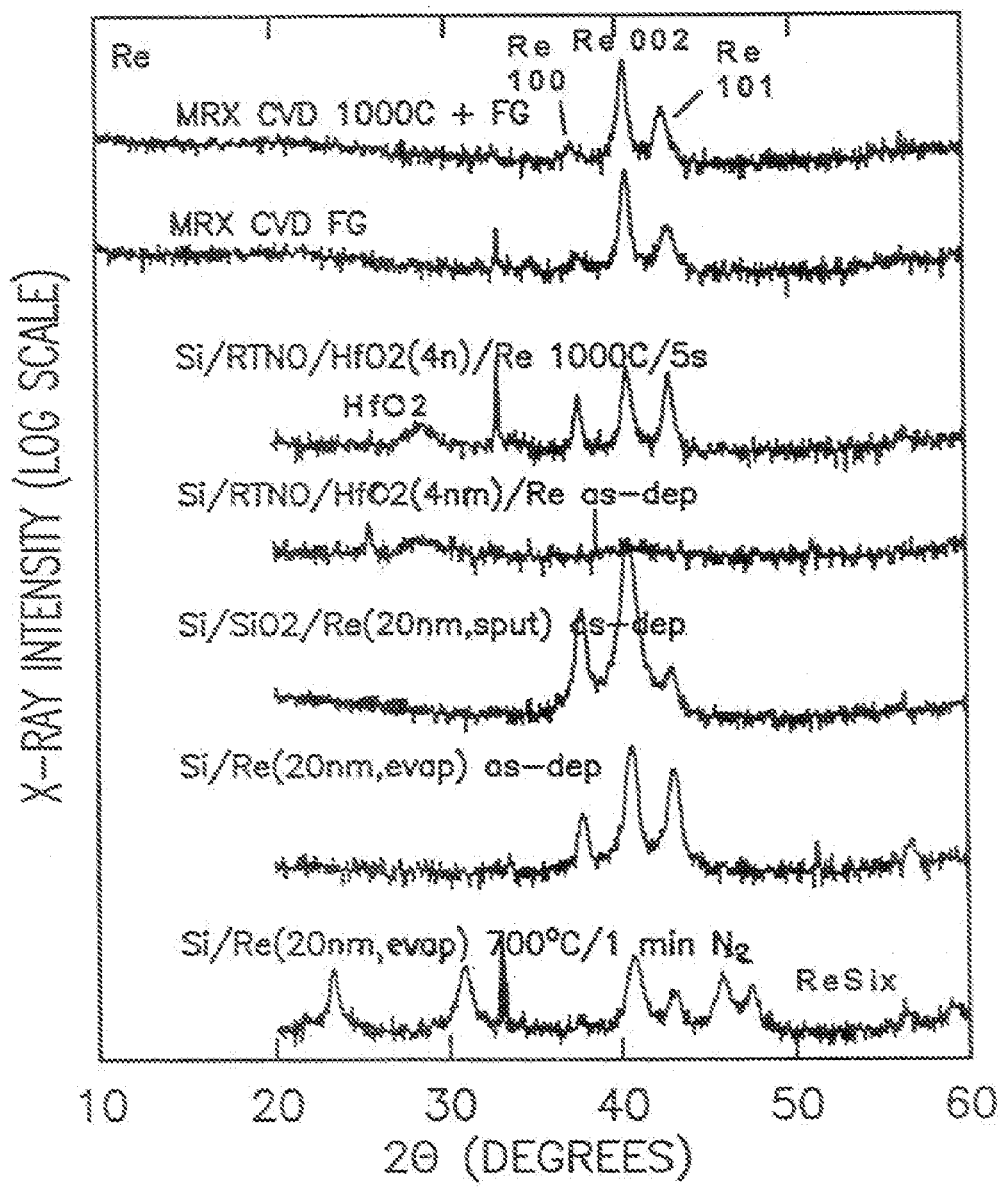
FIG. 13 exhibits the XRD diffraction patterns for deposited rhenium using conventional methods known in the art and using the photo-electrodeposition process of the invention.

FIGS. 12 and 13 show XRD characteristics of the metal layers obtained by electroplating as compared to other conventional techniques such as evaporation, chemical vapor deposition and sputtering. Ru and Re were deposited by the conventional techniques under standard conditions. As shown in FIGS. 12 and 13, the crystal structure orientation (100/002/101) for both ruthenium and rhenium vary depending upon the deposition process used. In the case of ruthenium (FIG. 12), the CVD and PVD/annealed exhibit quite similar crystal structure orientation in that the 002 intensity dominates the XRD and there appears to be very little contribution of 100 (comparing the peak intensities of both 002 and 101). In comparison, the ruthenium that is photo-electrodeposited by the process of the invention exhibits a crystal structure orientation in which 101 dominates the XRD and 100 and 002 exhibit similar intensities.

In the case of rhenium (see, FIG. 13), the as deposited evaporated Re (spectrum b) and the PVD/annealed Re (spectrum e) exhibit quite similar crystal structure orientation in that all three crystal orientations exhibit similar intensities in the XRD. In comparison, the Re that is photo-electrodeposited by the process of the invention exhibits a crystal structure orientation in which 002 peak dominates and there is very little contribution from 100.

We claim:

1. An electrochemical process comprising:
providing a 125 mm or larger semiconductor wafer in electrical contact with a conducting surface, wherein at least a portion of the semiconductor wafer is in contact with an electrolytic solution, said semiconductor wafer functioning as a first electrode;
providing a second electrode in the electrolytic solution, the first and second electrode connected to opposite ends of an electric power source; and
irradiating a surface of the semiconductor wafer with a light source as an electric current is applied across the first and the second electrodes,
wherein the electrochemical process is an electroplating process in which one or more elements from the group consisting of Ru, Re, Ni, Pd, Co, Pt, Rh, Cr, Mn, Cu, Fe, Zn, Cd, Ce, Ta, Hf, Ti, Al, V, Ga, Ge, As, Se, Nb, Mo, Ag, In, Sn, Sb, Te, W, Os, Ir, Au, Hg, Tl, Pb, Bi or any combination thereof is electroplated on the semiconductor wafer,
wherein the light source is provided within a tool head that is in contact with the electrolyte solution and is pneumatically sealed from the electrolyte solution,
wherein the irradiated surface of the semiconductor wafer is opposite to the side at which the electroplating process takes place, and
wherein the conducting surface is a mesh electrode.

2. The process of claim 1 wherein the semiconductor wafer is a doped or undoped semiconductor wafer selected from a Si semiconductor wafer, a Ge semiconductor wafer or a (Si—Ge) semiconductor wafer, or a doped or undoped binary, tertiary and quaternary semiconductor wafer comprising Ga, As, P, Sb, In, Se and Al.

3. The process of claim 1 wherein the semiconductor wafer is a doped or undoped II-VI semiconductor wafer comprising Cd, Zn, Te, Se and S, a doped or undoped oxide semiconductor wafer comprising Ti or Zr oxides, a Cu-based or Sr-based semiconductor wafer or a semiconductor-on-insulator semiconductor wafer selected from silicon-on-insulator or silicon germanium-on-insulator combinations.

4. The process of claim 1 wherein the semiconductor wafer comprises an electroluminescent polymer selected from polyacetylene, poly(dialkoxy p-phenylene-vinylene, poly(dialkylfluorene) and the derivatives of each thereof.

5. The process of claim 1, wherein the applied electric current is from 1 µA/cm² to 50 A/cm², and is operated in the galvanostatic, potentiostatic or pulse mode.

6. The process of claim 1 wherein the semiconductor wafer is a doped or undoped semiconductor wafer selected from a Si semiconductor wafer, a Ge semiconductor wafer or a (Si—Ge) semiconductor wafer, or a doped or undoped binary, tertiary and quaternary semiconductor wafer comprising of Ga, As, P, Sb, In, Al, Se, Cd, Zn, Te, Se and S.

7. The process of claim 1 further comprising annealing an electroplated metal or metal alloy to provide a predominantly crystalline metal film.

8. The process of claim 7 wherein the deposited and annealed metal film consists essentially of ruthenium, said ruthenium film having an XRD spectrum in which the reflected intensity for crystallographic orientation 101 is greater than that of 100 or 002.

9. The process of claim 7 wherein the deposited and annealed metal film consists essentially of rhenium, said rhenium film having an XRD spectrum in which the reflected intensity for crystallographic orientation 002 is greater than that of 002 or 100.

10. The process of claim 1 wherein the semiconductor wafer includes n-type silicon regions and p-type silicon regions, and
   wherein a selective electroplating of a metal on the p-type region occurs during the irradiation of the semiconductor wafer.

11. The process of claim 1 wherein the semiconductor wafer comprises p-type silicon with a dielectric.

12. The process of claim 1, further comprising:
   disposing a shutter between the semiconductor wafer and the light source.

13. A cathodic electroplating process of a 125 mm or larger, p-type semiconductor wafer with an optional insulating layer, the process comprising:
   positioning the 125 mm or larger, p-type semiconductor wafer in an electrolytic solution;
   positioning a counter electrode in the electrolytic solution;
   illuminating a back side of the semiconductor wafer with a light source; and
   applying an electric current to the semiconductor wafer and to the counter electrode,
   wherein the light source is provided within a tool head that is in contact with the electrolytic solution and is pneumatically sealed from the electrolytic solution; and electroplating one or more elements selected from the group consisting of Ru, Re, Ni, Pd, Co, Pt, Rh, Cr, Mn, Cu, Fe, Zn, Cd, Ce, Ta, Hf, Ti, Al, V, Ga, Ge, As, Se, Nb, Mo, Ag, In, Sn, Sb, Te, W, Os, Ir, Au, Hg, Tl, Pb, Bi or any combination thereof on the semiconductor wafer by applying an electric current from 1 $\mu$A/cm$^2$ to 50 A/cm$^2$, said electric current applied in galvanostatic, potentiostatic or pulse mode.

* * * * *